United States Patent [19]

Bauer

[11] Patent Number: 5,616,938
[45] Date of Patent: Apr. 1, 1997

[54] MOS-CONTROLLED POWER SEMICONDUCTOR COMPONENT FOR HIGH VOLTAGES

[75] Inventor: Friedhelm Bauer, Suhr, Switzerland

[73] Assignee: Asea Brown Boveri AG, Baden, Switzerland

[21] Appl. No.: 451,984

[22] Filed: May 26, 1995

[30] Foreign Application Priority Data

Aug. 8, 1994 [DE] Germany ............................ 44 27 988.4

[51] Int. Cl.$^6$ ....................... H01L 29/739; H01L 29/744; H01L 29/768; H01L 29/41
[52] U.S. Cl. ......................... 257/139; 257/147; 257/153; 257/341
[58] Field of Search ................................. 257/147, 152, 257/153, 139, 341, 342, 328, 329, 335, 336

[56] References Cited

U.S. PATENT DOCUMENTS

| | | | |
|---|---|---|---|
| 5,285,094 | 2/1994 | Mori et al. | 257/341 |
| 5,289,981 | 3/1994 | Kamiwano et al. | 241/261.1 |

FOREIGN PATENT DOCUMENTS

| | | | |
|---|---|---|---|
| 0186140 | 7/1986 | European Pat. Off. | 257/152 |
| 0528349 | 2/1993 | European Pat. Off. | |
| 0559945 | 9/1993 | European Pat. Off. | |
| 4024526 | 2/1991 | Germany | |
| 0283669 | 12/1987 | Japan | 257/341 |

OTHER PUBLICATIONS

F. Bauer, "The MOS Controlled Thyristor And Its Limits", Power Semiconductor Devices & Circuits, (1992), pp. 31–61.

J. Baliga, "Evolution of MOS-Biplor. . . Technology", Proceedings Of The IEEE, vol. 76, No. 4, Apr. 1988, pp. 409–418.

T. Laska et al., "A 2000 V Non–Punchthrough. . . Ruggedness", Solid–State Elec., vol. 35, No. 5, pp. 681–685, 1992.

A. Hefner, Jr., "A Performance Trade-Off. . . Reduction" IEEE Trans. On Power Elec., vol. PE–2, No. 3, Jul. 1987, 194–207.

Dr. Dah Wen Tsang, "A Single Critical Mask. . . Power Transistors" EPE Journal, vol. 2, No. 2, Jun. 1992, pp. 95–100.

Primary Examiner—Peter Toby Brown
Attorney, Agent, or Firm—Oblon, Spivak, McClelland, Maier & Neustadt, P.C.

[57] ABSTRACT

In an MOS-controlled power semiconductor component having a multiplicity of cathode cells, the surface area proportion of the cathode cells relative to the total component surface area is selected at between 0.1% and 10% in the case of circular cell geometry and between 0.4% and 40% in the case of strip-shaped cell geometry. As a result of this, the susceptibility to oscillation caused by small inductances can be reduced. (FIG. 1)

5 Claims, 2 Drawing Sheets

MOS-CONTROLLED POWER SEMICONDUCTOR COMPONENT FOR HIGH VOLTAGES

BACKGROUND OF THE INVENTION

1. Field of the Invention

The invention relates to the field of power semiconductor components. It is based on an MOS-controlled power semiconductor component according to the preamble of the first claim.

2. Discussion of Background

Such an MOS-controlled power semiconductor component has already been described, for example in European Patent Application EP 0,528,349 A1. This application relates to an IGBT having a high breakdown voltage.

IGBTs of this type, or MOS-controlled power semiconductor components in general, comprise, in a semiconductor substrate between an anode and a cathode, a number of differently doped semiconductor layers and, on the cathode side, a multiplicity of unit cells or cathode cells connected in parallel. These cathode cells have a gate which is arranged so as to be insulated, by means of which the component can be switched on and off. Depending on the type of component, the cathode cells and the semiconductor layers are designed in different ways.

Various structures, specific to requirements, may be provided on the anode side. For IGBTs, examples of this can be found in the texts "A Performance Trade-Off for the IGBT: Buffer Layer versus Base Lifetime Reduction" by A. R. Hefner et al., IEEE Trans. on Power Electronics, Vol. PE-2, No. 3, July 1987 and "A 2000V Non-punchthrough IGBT with High Ruggedness" by T. Laska et al., Solid State Electronics, Vol. 35, No. 5, pp. 681–685, 1992.

As explained by F. Bauer et al. in their paper to the International Symposium on Power Semiconductor Devices & ICs 1994 "On the Suitability of BiMSO High Power Devices in Intelligent Snubberless Power Conditioning Circuits", Proc. ISPSD, Davos 1994, page 201 ff., components of this type are susceptible to oscillations. These oscillations are caused, in particular, by an interaction of the emitter inductance necessary for limiting the current variation $dI_a/dt$ with the gate-cathode capacitance inherent in the structure. Oscillations of this type considerably limit the performance of the component and can impair the lifetime.

In the abovementioned article by F. Bauer et al., the susceptibility to oscillation was examined above all on the basis of MCTs. Continuing examinations have, however, shown that all currently known MOS-controlled power semiconductor components exhibit this phenomenon.

The MCT is described in the article "MOS-Controlled Thyristors—A New Class of Power Devices" by V. A. K. Temple, in IEEE Transactions on Electronic Devices, Vol. ED-33, No. Oct. 10, 1986, or in the paper by F. Bauer "The MOS Controlled Thyristor and Its Limits", in Power Semiconductor Devices and Circuits, Edited by A. A. Jaecklin, Plenum Press, New York 1992, pp. 31–61. The IGBT or IGT is described by B. J. Baliga in "Evolution of MOS-Bipolar Power Semiconductor Technology", in Proceedings of the IEEE, Vol. 76, No. 4, April 1988. Another MOS-controlled power semiconductor component is the FiBS (Five Layer Bipolar Switch), described by K. Lilija in U.S. Pat. No. 5,289,981 and European Patent Application EP 0,487,869 A1, or the IGTH or BRT (BRT=base resistance controlled thyristor), described by F. Bauer et al. in German Offenlegungsschrift DE 40,24,526 A1. All components referred to are susceptible to oscillations which can limit the performance and the lifetime.

SUMMARY OF THE INVENTION

Accordingly, one object of the invention is to provide a novel MOS-controlled power semiconductor component in which the abovementioned susceptibility to oscillation does not occur, which is cost-effective and simple to produce and further has low switching losses.

This object is achieved in the case of an MOS-controlled power semiconductor component of the type mentioned at the outset by virtue of the features of the first claim.

A fundamental feature of the invention is thus that the coupling of the anode and cathode is increased. This can be done, on the one hand, by inserting an external capacitance, of the order of magnitude of 1 nF/cm$^2$, between the gate and anode or by the cathode cells taking up between 0.1% and 10% of the total component surface area in the case of circular cell geometry and taking up between 0.4% and 40% of the total component surface area in the case of strip-shaped cell geometry. This can be achieved, in a preferred exemplary embodiment, by selecting the cell separation to be between 25 µm and 250 µm. A separation of between 70 µm and 150 µm is particularly advantageous.

Further exemplary embodiments result from the structure of the cathode cells. They are described in corresponding dependent claims.

The advantage of the construction according to the invention consists in that, as a result of the fact that the surface area proportion of unit or cathode cells is relatively small or the separation between two cells is selected to be large in comparison with the prior art, the susceptibility of the components to oscillation essentially disappears. This is in complete contrast to the components according to the prior art, in which the cell separation is very much smaller, see, for example, the article by A. R. Hefner et al. mentioned at the outset, in which the cell separation is only equal to 10 µm. The effect is furthermore obtained that the wide structures according to the invention have smaller switching losses. A longer lifetime than with the prior art is thereby achieved. This is above all due to the fact that it is possible to do without a relatively highly doped, so-called JFET zone between and under the unit cells. This provides the advantage that one process step can be left out. The component is therefore simpler and less expensive to produce. This, for its part, also reduces the rejection rate and increases the reliability because of smaller process fluctuations. It is furthermore possible to reduce the circuitry of the elements since an emitter inductance for limiting $dI/dt$ no longer produces any oscillations, and other compensation elements can be done without.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
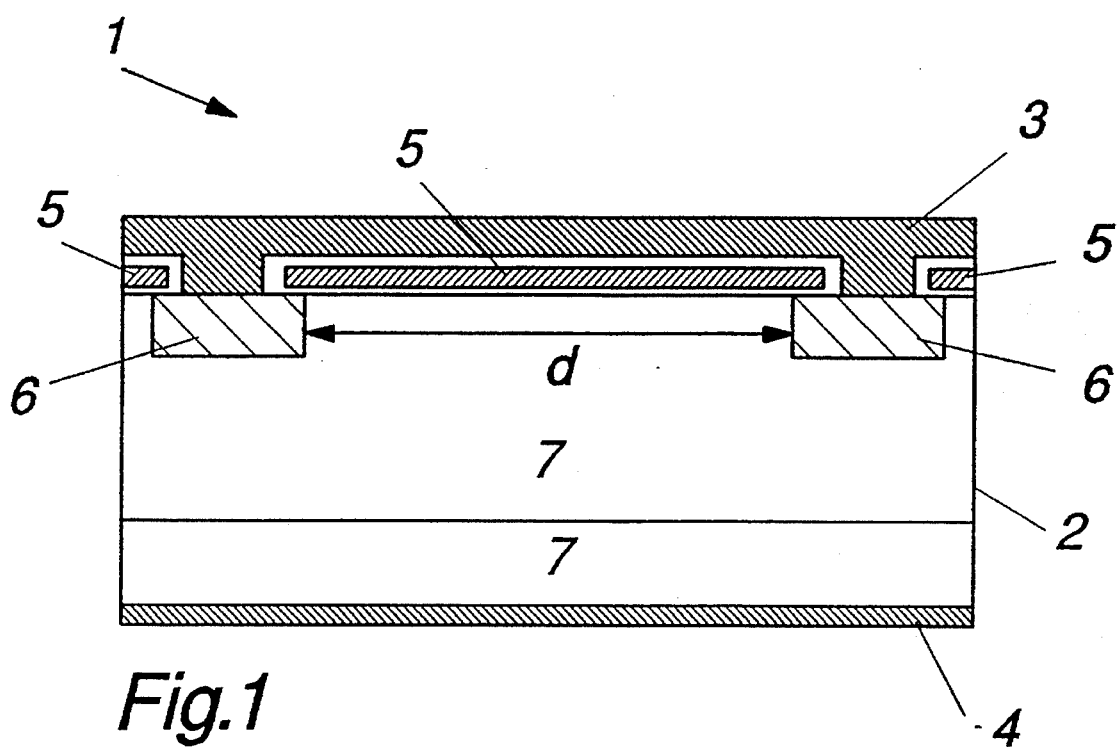
FIG. 1 shows a section of a power semiconductor component according to the invention, in which the unit cells are indicated only schematically.

The reference designations used in the drawings and their meaning are listed in summarized form in the List of Designations.

DESCRIPTION OF THE PREFERRED EMBODIMENTS

Referring now to the drawings, wherein like reference numerals designate identical or corresponding parts throughout the several views, FIG. 1 schematically shows a section of an MOS-controlled power semiconductor component according to the invention. A number of differently doped semiconductor layers 7 are arranged in a semiconductor substrate 2 between a cathode 3 and an anode 4 which are indicated only in outline. In addition, a multiplicity of cathode cells 6 are embedded in the semiconductor substrate 2, starting from the cathode-side surface. A gate 5 is provided above the cathode cells 6. The gate 5 is insulated from the cathode 3, for example by an oxide layer (MOS arrangement). By applying a voltage to the gate 5, the flow of current through the component 1 can be controlled, that is to say that it can be switched on and off.

Figure 2A:
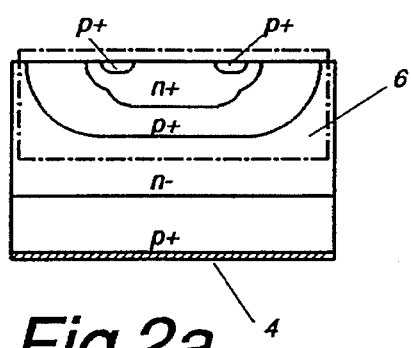
FIGS. 2a–d show various types of unit cells.
Figure 2B:
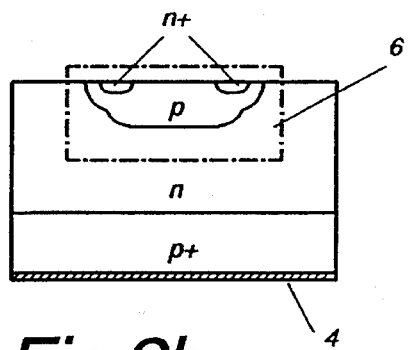
Figure 2C:
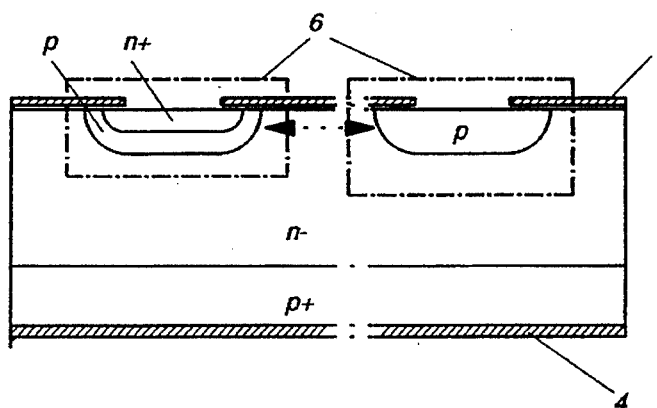
Figure 2D:
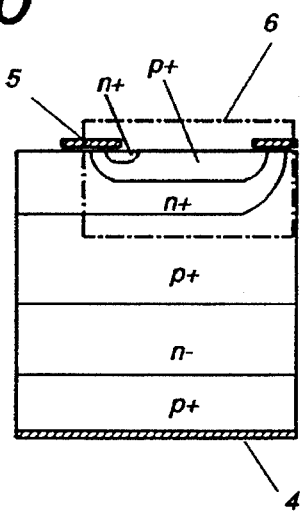

The mode of operation of such power semiconductor components is well known from the prior art mentioned at the outset, so that it is not necessary to provide a detailed description at this point. The invention is not limited to a special type of MOS-controlled power semiconductor components, but will successfully be used for all unit cell types represented in FIGS. 2a–d. Specifically, these are an MCT (FIG. 2a) having a four-layer structure and p+ doped short circuits, an IGBT (FIG. 2b) having a three-layer structure and n+doped short circuits, an IGTH or BRT (FIG. 2c) having a three-layer structure and two types of unit cells, one of which comprises only a p+ well and the other additionally comprises an n+ doped well which is embedded in the p+ well, and an FiBS (field controlled bipolar switch) having a five-layer structure and n+ doped, MOS-controlled source regions.

With all components of this type, it is sought to protect the customarily provided freewheeling diode from excessively steep current edges dI/dt by means of small inductances. In the ISPSD '94 article mentioned at the outset, it was, however, recognized that the components are susceptible to oscillations, amongst other reasons because of these inductances. The problem is explained in more detail hereinbelow with reference to an IGBT.

In the case of this component, the inductances are connected to the emitter (emitter inductances). The susceptibility to oscillation is essentially based on the fact that the voltage induced across the emitter inductance is coupled back into the gate circuit of the IGBT via the gate-cathode capacitance inherent in the structure. The oscillations are limited only by avalanche processes and can with high probability lead to destruction of the component. The oscillations can in addition even occur at inductance values which are only slightly larger than typical inductances of bonding wires.

In order to prevent susceptibility to oscillation in the application, the coupling between the anode and the cathode is now increased according to the invention. This is done by raising the gate-anode capacitance. To this end, the separation d between two cathode cells is, according to the invention, in contrast to the prior art, selected to be quite large. The separation criterion can, in the general case, also be expressed as surface area proportion of the cathode cells to the total component surface area.

In order effectively to avoid the susceptibility to oscillation, the proportion of the cathode cells with respect to the total component surface area should be equal to between 0.1% and 10% in the case of circular cell geometry and between 0.4% and 40% in the case of strip-shaped geometry. In the case of components which are currently conventional, having a diameter of 1–2 cm, this results in a preferred separation between neighboring cells of between 25 µm and 250 µm. On the grounds of technical advantages, separations of between 70 µm and 150 µm are particularly preferred.

Of course, all known measures such as anode short circuits, soft layers or barrier layers may be provided on the anode side. In addition, the invention is not limited to the above-explained IGBT, but is advantageously used in the case of all MOS-controlled power semiconductor components.

The advantages of the selection, according to the invention, of the separation of two cathode cells or the surface area proportion of the cathode cells consist in that the susceptibility to oscillation, caused by small inductances, essentially disappears and a cost-effective dI/dt protection of the freewheeling diodes can thereby be achieved without large switch-on snubbers. The wide structures also have a low sensitivity to process fluctuations. In particular, relatively highly doped, so-called JFET zones between and under the unit cells can be left out. As a result of this the production process is simplified and is therefore less expensive. Furthermore, omission of the relatively highly doped JFET zones has the result that smaller field strengths predominate inside the component. As a result of this, smaller switching losses are obtained and the lifetime of the components is longer.

In contrast to the prior art, in which ever smaller structures must be resorted to in the lower voltage range (up to approximately 600 V), the wide structures, according to the invention, in high-voltage components thus provide many and varied advantages.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. An MOS-controlled power semiconductor component for high voltages, comprising, in a semiconductor substrate a cathode and an anode, a number of differently doped layers and a multiplicity of cathode cells, embedded on the cathode side and controlled by an MOS gate, wherein the cathode cells take up between 0.1% and 10% of the total component surface area in the case of a circular cell geometry and take up between 0.4% and 40% of the total component surface area in the case of a strip-shaped cell geometry, wherein a lateral separation d between two neighboring cells is equal to between 70 µm and 150 µm.

2. The power semiconductor component as claimed in claim 1, wherein the cathode cells have the structure of a unit cell of an MOS-controlled thyristor (MCT).

3. The power semiconductor component as claimed in claim 1, wherein the cathode cells have the structure of a unit cell of an insulated-gate bipolar transistor (IGBT).

4. The power semiconductor component as claimed in claim 1, wherein the semiconductor substrate comprises, starting from the anode, a heavily p-doped layer and a lightly n-doped layer as well as two types of unit cells which are formed by a heavily p-doped well embedded in the lightly n-doped layer, the one type of unit cells additionally comprising a heavily n-doped well which is embedded in a p well.

5. The power semiconductor component as claimed in claim 1, wherein the semiconductor substrate comprises a 5-layer structure and the unit cells are formed by a heavily p-doped well in which a heavily n-doped source region is embedded.

* * * * *